United States Patent
Lund et al.

(12) 
(10) Patent No.: US 6,224,413 B1
(45) Date of Patent: May 1, 2001

(54) AUTODOCKING ASSEMBLY AND METHOD

(75) Inventors: David G. Lund, Byron; Scott A. Shurson, Kasson, both of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/045,934

(22) Filed: Mar. 23, 1998

(51) Int. Cl.[7] .............................. H01R 4/50; H01R 13/625
(52) U.S. Cl. ............................................................. 439/342
(58) Field of Search ............................. 439/61, 377, 342, 439/376, 341

(56) References Cited

U.S. PATENT DOCUMENTS

| | | | |
|---|---|---|---|
| 3,869,185 | * | 3/1975 | Teagno ..................................... 339/65 |
| 4,573,753 | * | 3/1986 | Vogl ................................. 339/17 LM |
| 4,614,389 | * | 9/1986 | Albert et al. ....................... 339/45 M |
| 5,093,985 | * | 3/1992 | Houldsworth et al. ................ 29/830 |
| 5,210,680 | * | 5/1993 | Scheibler ............................... 361/384 |
| 5,326,277 | * | 7/1994 | Kuramitsu .............................. 439/327 |
| 5,339,222 | * | 8/1994 | Simmons et al. ..................... 361/818 |
| 5,366,385 | * | 11/1994 | Treleaven .............................. 439/377 |
| 5,406,455 | * | 4/1995 | Devenish .............................. 361/752 |
| 5,432,682 | * | 7/1995 | Giehl et al. ........................... 361/796 |
| 5,679,020 | * | 10/1997 | Lai et al. .............................. 439/342 |
| 5,726,867 | * | 3/1998 | Zarreli .................................. 361/818 |
| 5,751,551 | * | 5/1998 | Hileman et al. ...................... 361/753 |
| 5,822,189 | * | 10/1998 | Isshiki .................................. 361/736 |
| 5,860,515 | * | 1/1999 | Tomotoshi ............................ 200/550 |

* cited by examiner

*Primary Examiner*—Neil Abrams
*Assistant Examiner*—Chandrika Prasad
(74) *Attorney, Agent, or Firm*—Christopher H. Lynt

(57) ABSTRACT

An autodocking assembly for use with a circuit board includes a card holder adapted to accommodate and secure one of a plurality of electronic cards therein, and a pivot arm attached to the card holder which is adapted to pivot such that an edge connector of the one electronic card in the card holder docks with a corresponding slot connector on the circuit board.

19 Claims, 10 Drawing Sheets

AUTODOCKING ASSEMBLY AND METHOD

BACKGROUND OF THE INVENTION

1. Field of the Invention

The invention relates to the field of electronic circuit component cards having edge connectors for mating with corresponding slot connectors, such as peripheral component interconnect (PCI) cards which are pluggable into PCI slot connectors disposed on computer motherboards and backplanes, for example.

2. Background Information

Various electronic circuit component cards, also referred to as electronic cards and card devices herein, having edge connectors for mating with slot connectors on personal computer (PC) system motherboards and/or backplanes, for example, are known. These cards are generally classified by the bus type they are designed for, and a number of standard bus/card/connector types are currently in use. These standard types include ISA (Industry Standard Architecture—8/16 bits) and EISA (Expanded ISA—32 bits), SCSI (Small Computer System Interconnect), PCI (Peripheral Component Interconnect), MCA (Micro Channel Architecture), VLB (VESA Local Bus), AGP (Accelerated Graphics Port), and USB (Universal System Bus), to name just a few.

The card edge connectors typically have a number of relatively closely spaced metal contacts on one or both sides of the card edge, and the corresponding slots similarly have a like number of closely spaced metal contacts therein. When the card edge connector is inserted in the slot connector, the corresponding contacts make electrical connection. Through these contacts and their electrical connection, the card device and the personal computer system communicate data, address and control signals, for example. The card device also generally obtains electrical energy from the personal computer system through two or more of the contacts.

The card edge connectors have a predefined size and, in the case of PCI cards, for example, have key slots which align with corresponding key ridges provided within the slot connectors. These keyed features, as well as the fact that the slots of the slot connectors are closed at ends thereof, help to ensure that the card edge connector contacts align with the correct slot connector contacts when fully inserted. However, these card devices are generally designed with the assumption that they will be inserted by hand by the personal computer owner or technician. During insertion by hand, it is possible that there could be a momentary contact with an adjacent card or other nearby component, or there could be a momentary misalignment of the closely spaced edge contacts, causing a short circuit, for example. (It should be noted that the providing of the keyed features generally adequately prevents any contact misalignment during insertion.) Because of this, such cards are generally installed with the personal computer system turned off, i.e., "powered down."

The focus of the following discussion will be PCI-based card devices, however, the same factors addressed hold true for other types of card devices. The PCI bus is a synchronous, processor independent, 32- or 64-bit bus that functions similarly to a processor local bus. The PCI bus can be thought of as a buffered intermediate or so-called mezzanine bus, that is, an extension of the processor local bus. It is coupled to the personal computer processor local bus by so-called "bridge" circuitry, but maintains its own separate set of circuits. The original PCI bus specification required a constant speed of 33 MHz, which translates to a transfer rate of 80–120 Mbs in a 32-bit environment, and up to a 264 Mbs transfer rate in a 64-bit environment. The PCI bus operates on 5 volts, 3.3 volts, or both.

PCI and the other so-called local bus technologies, e.g., VESA (Video Electronics Standard Association), were developed to permit personal computers to communicate more quickly with peripheral devices, particularly video cards in the case of VESA where the "V" stands for video. Graphic operating systems and applications, for example, place a high throughput demand on a bus system. The original IBM PC (IBM is a registered trademark of International Business Machine Corporation) had a bus speed of about 1 megabyte per second, the IBM AT about 4 megabytes per second, a typical ISA bus about 8 megabytes to a maximum of 16 megabytes per second, the EISA bus has 32 megabytes per second, the MCA bus 20–40 megabytes per second, the VESA VL-1 has 20–132 megabytes per second, the VESA VL-2 up to 264 megabytes per second, the PCI 1.0 has 80–120 megabytes per second and the PCI 2.0 up to 264 megabytes per second. The VESA and PCI buses are called "local bus" technologies because the motherboard bus is bypassed, and the peripheral connected to the processor "local" bus, through the VESA circuitry or the PCI bridge circuitry. This permits peripherals to be run at the full CPU clock speed, over the full CPU 32- or 64-bit data path, with readily apparent benefits.

The PCI standard bus was also developed as a way to integrate peripherals in general onto personal computer motherboards. PCI buses have gained favor over other buses due in part to the fewer control lines used. A PCI bus uses 32 conductors to carry both the address and data lines, while a VESA VL-1 bus, for example, uses up to 64 (32 data and 32 address). This permits PCI cards to be, in general, smaller than other types of local bus cards.

For these reasons, and others, PCI buses, cards and card slots have become widespread in the personal computer (PC) market, and there are now a plethora of PCI-based card devices available. Until recently, personal computer buses and card devices, e.g., PCI buses and card devices, have not been used in mid-range to high-end, e.g., "mainframe," computer systems. Therefore, until recently, only the personal computer user has had the advantage of the wide range of available peripheral component interconnect (PCI) card devices, and the like. However, as personal computers and their peripherals have reached higher and higher performance levels, and have become more and more varied, their integration into mid-range to high-end computer systems has been given serious consideration. It has now been recognized that the users of mid-range to high-end computer systems could benefit from the variety, versatility and availability of PCI card devices, and the like.

Therefore, a need existed for a way to accommodate these PCI card devices, and the like, in mid-range to high-end computers. Mid-range and high-end computer systems are now being shipped with PCI card devices. One example of a mid-range computer is the IBM AS/400 series (AS/400 is a registered trademark of International Business Machine Corporation).

While providing a PCI bus and card connector on a mid-range to high-end computer system motherboard or backplane, for example, to meet the above-identified need may seem to be relatively straight forward, and admittedly, can be accomplished with sufficient effort, there are a number of related technical issues which have to be addressed in doing so. One of these issues relates to common differences in the way personal computers and mid-range to high-end computers are put to use, as will be explained.

PCI and similar electronic card devices generally derive power from the personal computer motherboard or backplane through the card slot they are plugged into. Further, it is generally assumed in the design of the cards that they will be plugged in by hand when the power to the personal computer is off, to avoid the possibility of damage to components on the cards and/or motherboard, should there be a momentary contact with an adjacent card or component, or a misalignment of the closely spaced contacts, during insertion causing a short circuit or connection of power to the wrong contact, for example, as mentioned earlier.

This requirement that power be off during insertion and/or extraction of the card is inconvenient but generally tolerable when the card devices are used in the typical desktop personal computer. Because PCI and other types of card devices designed for personal computers are not designed to be able to be plugged in while the computer system is powered up, until now, their use in high-end and mid-range computer systems could have undesirable consequences.

In mid-range to high-end systems, uninterrupted service is highly desirable and therefore, it is also desirable to be able to "hot plug" peripheral devices and their controller cards, that is, plug them in and take them out without turning off the power to the computer system. This is sometimes referred to as "concurrent maintenance." Since such computer systems typically are used to perform critical business functions, for example, the losses in productivity and the resultant economic costs associated with computer system down-time can be significant. Such systems may be serving many users concurrently.

Besides the desire for uninterrupted service, there may be considerable penalties involved with powering-down and powering-up such computer systems to add or replace components. For example, currently running programs must be halted and sometimes large amounts of data saved to non-volatile storage, before the system can be powered down without risking data loss. In mid-range and high-end computer systems, considerable amounts of time and inconvenience may thus be involved in performing unscheduled shutdown and restart operations in an orderly fashion.

In personal computer systems, the above are generally not significant factors to be considered when a new card device is to be added or when an existing card device requires service or replacement. Powering down and restarting a PC does not generally cause the concern it would cause for a user of a mid-range to high-end computer system since, with some exceptions, these are relatively quick and simple operations. Providing uninterrupted customer service even when a system is being upgraded or components repaired is highly desirable and may even be essential for commercial viability in mid-range to high-end systems due to the factors mentioned above. However, this is generally not a major concern with a typical desk-top PC since the PC is not typically performing as critical a business function.

Therefore, in order to take advantage of the multitude of circuit cards, e.g., PCI cards, designed for personal computers, in a mid-range to high-end computer system, without incurring disadvantageous system down-time, a need has existed for a way to safely hot-plug PCI card devices in a mid-range to high-end computer system, avoiding the danger of contact with powered-up adjacent cards or components, for example. This need is met by the autodocking assembly and method described and disclosed herein.

At this point, it should also be mentioned that besides the autodocking assembly and method described herein which prevents accidental contact with adjacent cards or component, in order to achieve hot-plugging, there may be other engineering issues involved. For example, it may be necessary or desirable to place unused slots in a quiescent powered-down state until a card device is plugged therein. This serves to avoid transients, for example, which may occur as the electrical connection is made between the slot and card edge contacts. Since no two metal contact surfaces are perfect, when they are mechanically brought together, there may initially occur what is commonly called "bounce," i.e., a momentary making and breaking of electrical connection, until the contact surfaces are securely aligned. Such bounce can result in electrical noise which could be misinterpreted as data or control signals, for example. Further, some electronic components may not tolerate the power spikes which could result from this bounce. In an IBM proprietary solution, the bus slot is kept quiescent until it is detected that a card device is seated therein, at which point power can be safely applied to the slot connector and associated card device. Therefore, it should be understood that additional engineering issues may need to be addressed in order to use the present autodocking assembly and method in a given situation, i.e., with a particular slot/card electrical configuration.

Although typically the factors making hot-pluggability highly desirable in mid-range to high-end computer systems are not as relevant to PCs, there may be a number of exceptions. In recent years, desktop personal computers have become more and more powerful, and have even been adapted to operate as network servers, and the like, for small businesses. In such a role, there are the same kind of penalties for down time as with mid-range to high-end computer systems.

Therefore, a need has also existed for a way to safely hot-plug PCI cards, and the like, in personal computer systems, especially those used as network servers and the like.

Within the International Business Machines Corporation, there have been some efforts at providing circuit board autodocking before, referred to here as "above the card solutions." However, PCI cards, and the like, sometimes not only have bottom edge connectors for mating with corresponding PCI motherboard/backplane slots, but also have top edge connectors for connections to other components. The previous above the card solutions did not accommodate these top edge connectors. Therefore, a need has existed for an autodocking design which would permit connectors on the top edge as well as the bottom.

It is also noted that these prior above the card solutions used a number of component parts, complicating assembly and manufacturing, and that these solutions generally would not work with a variety of types of cards. Therefore, a need existed for an autodocking design which reduced the number of parts and could accommodate a number of different cards.

SUMMARY OF THE INVENTION

It is, therefore, a principle object of this invention to provide an autodocking assembly and method.

It is another object of the invention provide an autodocking assembly and method which solves the above mentioned problems so that personal computer type card devices can be inserted or extracted without the need for powering down a computer system, particularly advantageous in mid-range to high-end computer systems.

These and other objects of the present invention are accomplished by the autodocking assembly and method disclosed herein.

According to an aspect of the invention, an autodocking assembly for a circuit board includes a card holder adapted to accommodate and secure one of a plurality of electronic cards therein, and a pivot arm attached to the card holder. For example, the card holder can be received in the pivot arm. The pivot arm is adapted to pivot such that an edge connector of the one electronic card in the card holder docks with a corresponding slot connector on the circuit board.

According to another aspect of the invention, a pivot rod is provided about which the pivot arm pivots. The pivot rod can advantageously be disposed on the circuit board, a housing in which the circuit board is disposed, or on a board stiffener, for example. The pivot rod is placed at a location which enables the edge connector of the one electronic card in the card holder received in the pivot arm to dock with the corresponding slot connector on the circuit board.

According to another aspect of the invention, the card holder is removably attached to the pivot arm, and the pivot arm is removably attached to the pivot rod.

According to another aspect of the invention, the pivot rod is disposed at a distance from the corresponding circuit board connector so that the edge connector of the one electronic card in the card holder received in the pivot arm docks with the corresponding slot connector on the circuit board without binding.

According to another aspect of the invention, the pivot rod is disposed in alignment with a center of the corresponding circuit board slot connector.

According to another aspect of the invention, the pivot arm includes an upright segment and an extending segment, the extending segment extending at substantially a right angle from the upright segment. The extending segment has a channel adapted to receive a corresponding rail on an edge of the card holder so that the card holder is slidably received thereby, and a latch for use in holding the pivot arm in a raised position during insertion or removal of a card holder with electronic card therein, and which may also serve the purpose of securing the card holder to the pivot arm.

According to another aspect of the invention, the pivot arm upright segment includes a slot for securably receiving a retainer disposed on the one electronic card when the card holder is slidably received in the pivot arm.

According to another aspect of the invention, the card holder is adapted to provide access to at least one further connector disposed at or near an edge of the one electronic card opposite the edge connector when the card holder is slidably received in the pivot arm.

According to another aspect of the invention, the pivot arm includes at least one passage through which a cooling gas can pass.

According to another aspect of the invention, the card holder includes at least one passage through which a cooling gas can pass.

According to another aspect of the invention, the card holder is adapted to receive at least one of the following types of electronic cards: a full length peripheral component interconnect (PCI) card; a half length peripheral component interconnect (PCI) card; a 32 bit peripheral component interconnect (PCI) card; a 64 bit peripheral component interconnect (PCI) card; an industry standard architecture (ISA) card; an expanded ISA (EISA) card; a small computer system interconnect (SCSI) card; a micro channel architecture (MCA) card; a virtual extended system architecture (VESA) card; an accelerated graphics port (AGP) card; and a universal system bus (USB) card.

According to another aspect of the invention, the card holder includes snap guides which receive and secure the one electronic card to the card holder.

According to another aspect of the invention, a method of autodocking an electronic card includes utilizing the assembly.

According to another aspect of the invention, a method of autodocking an electronic card edge connector to a circuit board slot connector includes providing a card holder and a pivot arm which pivots about a pivot point disposed a distance from the circuit board slot connector; securing the electronic card to the card holder; attaching the card holder to the pivot arm; and pivoting the pivot arm about the pivot point, whereby the edge connector of the electronic card docks with the corresponding slot connector on the circuit board.

These and other aspects of the invention will become apparent from the detailed description set forth below.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Figure 1:
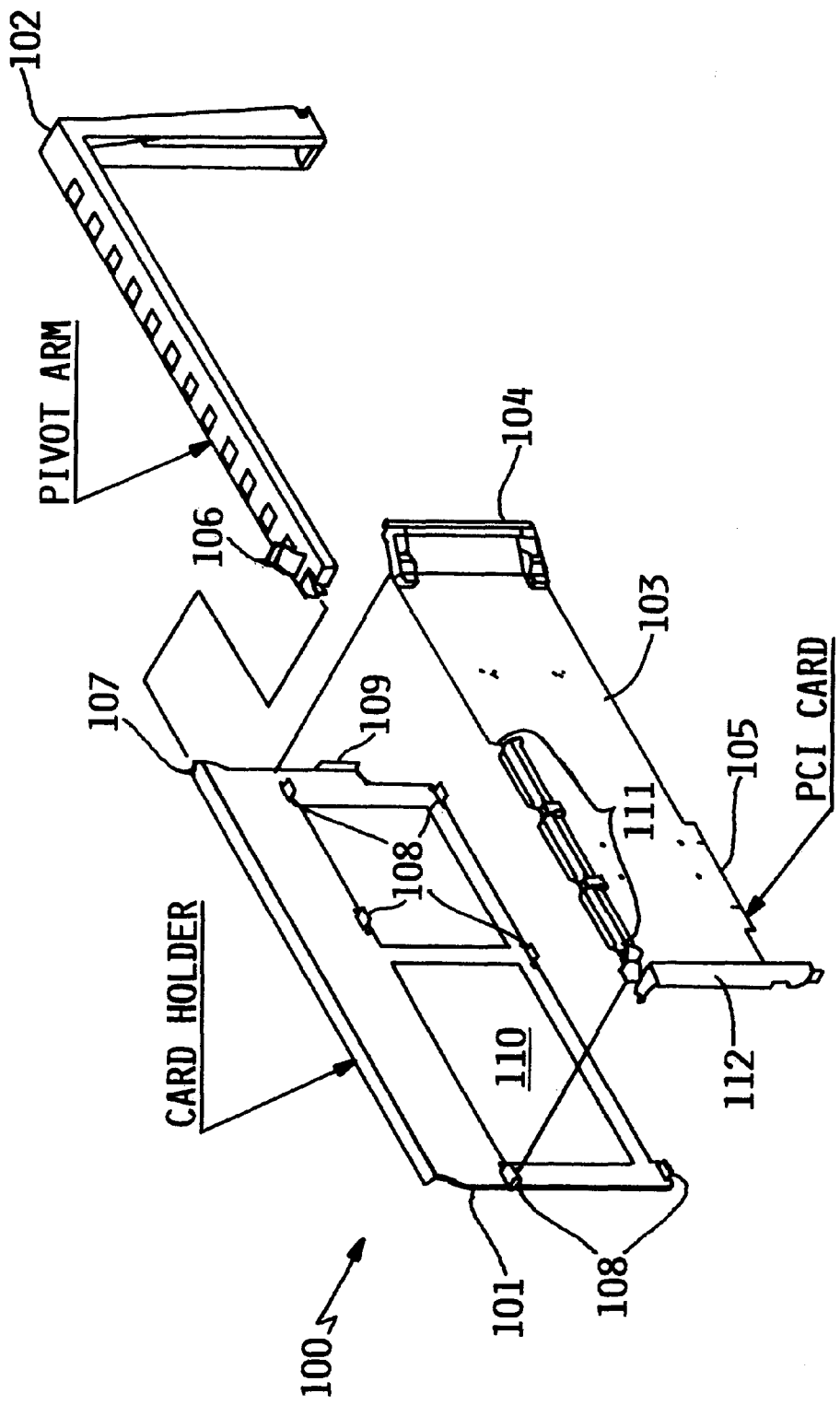
FIG. 1 illustrates an exploded view of an autodocking assembly according to an exemplary embodiment of the present invention.

Referring to FIG. 1, an exemplary embodiment of the invention is illustrated and indicated generally by reference number 100 and referred to herein as an autodocking assembly. A card holder 101 which is removable from a pivot arm 102, is adapted to receive an electronics card, e.g., PCI card 103. The typical PCI card 103 is provided with a retainer 104 according to the PCI specification (e.g., the current version: 2.1). PCI card 103 has edge connector 105 along a portion of a bottom edge which mates with a PCI slot connector on a PCI motherboard or backplane. The component pieces 101 and 102 comprise the autodocking assembly 100.

A latch 106 is provided on pivot arm 102 for securing the pivot arm 102 in a raised position for insertion of the card holder 101 therein, and the latch 106 may also serve to secure the card holder 101 when inserted in pivot arm 102. The top edge 107 of card holder 101 is flanged forming a rail which is T-shaped in cross-section and which slidably fits into a corresponding channel in pivot arm 102. Of course, the motherboard or backplane and therefore the card holder 101, card 103, and pivot arm 102, could be oriented in a number of ways so that the relative terms "top" and "bottom" describe how the components are oriented in the figure, which is a common orientation in actual use.

The card holder 101 is provided with protrusions 108 which serve to secure and align an electronics card, such as PCI card 103, thereto. A stop 109 is also provided on card holder 101 for this purpose. The card holder 101 is provided with one or more through-holes 110 which, as will be described in more detail later, provide for enhanced flow of a cooling gas, such as air, over and around the electronic circuits provided on the card 103, as well as providing clearance for pin stick through and/or any components mounted on the reverse side of a card 103. The card 103 installed into the card holder 101 will be referred to as a card/card holder assembly for simplicity in the following discussion.

The illustrated card 103 is provided with one or more connectors 111 at or adjacent to a top edge. As will become more apparent later, the card holder 101 is designed to accommodate these top edge connectors 111, that is, to provide ample clearance so as not to interfere with their easy access and use. As mentioned, the PCI card 103 has a retainer 104 at one end. As illustrated, the PCI card 103 is also provided at the opposite end with a standard bracket 112 (sometimes called a tailstock) normally used to secure the card 103 to the frame of a personal computer. PCI cards are designed to have their electronic components mounted on the left side of the card when viewed from the front of the personal computer. In this regard, for the purposes of this discussion, the retainer 104 is provided at the "front" edge of the card 103 while the bracket 112 is provided at the "back" edge of the card 103, front and back being defined in terms of the front and back of a conventional personal computer installation. Therefore, in FIG. 1, the electronic components on a PCI card 103 would be on the left side of the card 103 which is the side visible in the figure, and is the side of the electronics card 103 oriented away from the card holder 101. This is the convention in PCI type cards, however, through-holes 110 may be arranged to provide clearance for any components mounted on the other side of a card.

A card holder designed for cards other than PCI cards could be configured so that the electronic card would be mounted on the other side of the card holder than that shown in FIG. 1. Generally, the electronic card would be mounted on the side of the card holder so that the electronic components are on the opposite side away from the card holder. However, by virtue of the one or more through holes 110, even electrical components mounted on the side of an electronics card facing the card holder would generally have ample clearance.

Figure 1A:
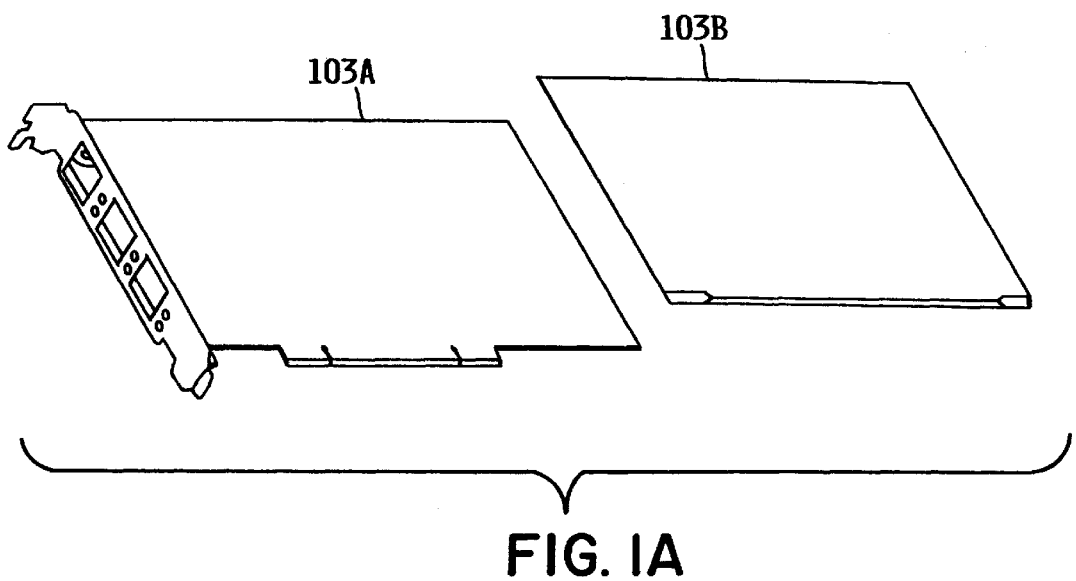
FIG. 1A illustrates a half-size card and half-size spacer panel.

FIG. 1A illustrates a half-size card 103A and a half-size spacer panel 103B which is used to adapt a full-sized card holder 101 for use with the half-sized electronics card 103A. As will be described later and with reference to FIG. 5, there are other ways the card holder 101 could be adapted to accommodate either full-sized or half-sized electronic cards. The spacer panel 103B in this case would serve to align the half-sized card 103A in the card holder 101 while also covering the through-hole 110 which is not covered by the half-sized card 103A.

Figure 2:
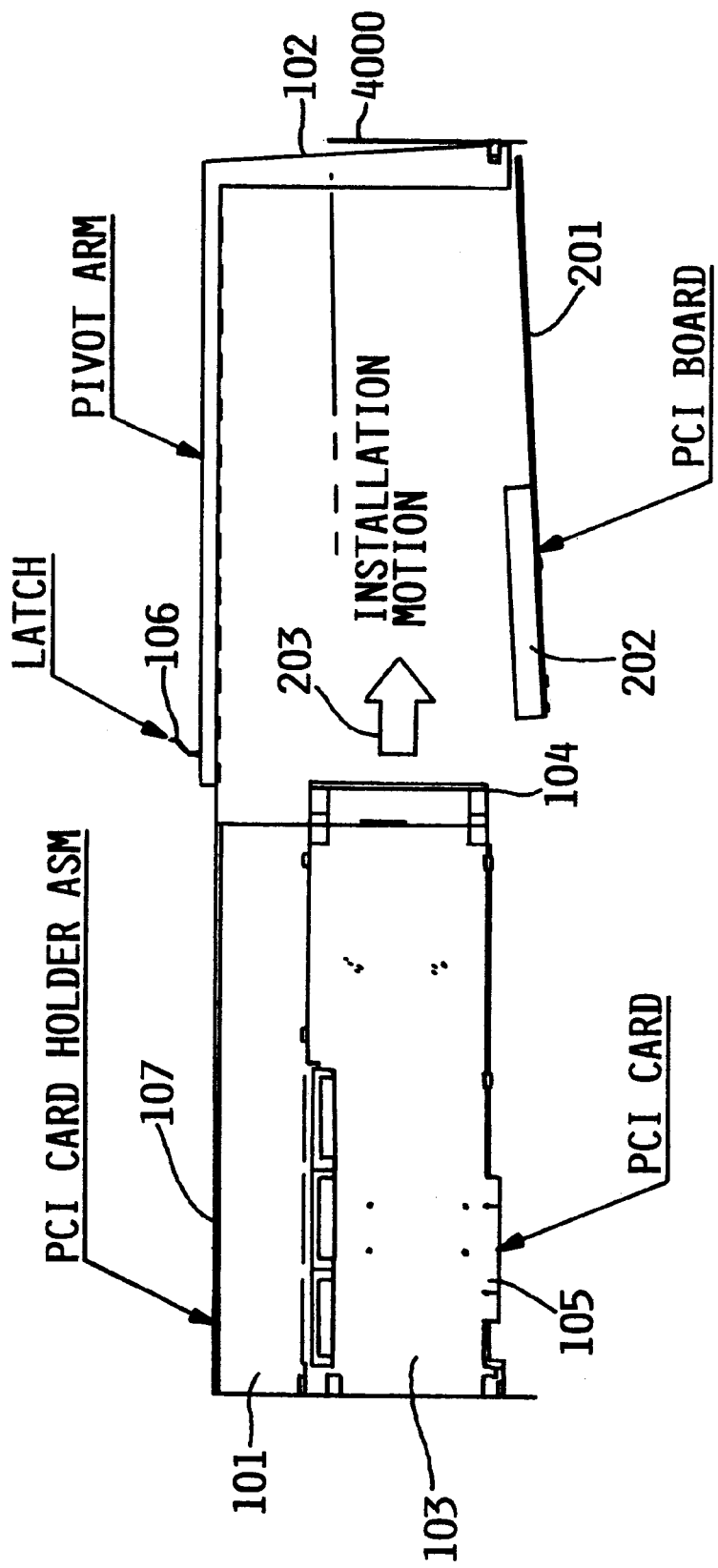
FIG. 2 illustrates installation of a card holder, with an electronics card mounted thereon, into a pivot arm according to an exemplary embodiment of the invention.

FIG. 2 illustrates how a card holder 101 with electronics (PCI) card 103 is installed into pivot arm 102 above the PCI motherboard 201 with PCI slot connector 202. As can be seen, the top flanged edge 107 of the card holder 101 is guided into the channel of the pivot arm 102 and the card/card holder assembly is moved in the direction of arrow 203. The pivot arm 102, as can be seen, is tipped slightly up and away from the motherboard 201, i.e., at an angle to the motherboard 201, to permit the card holder 101 to be attached to the pivot arm 102 without obstruction.

Figure 3:
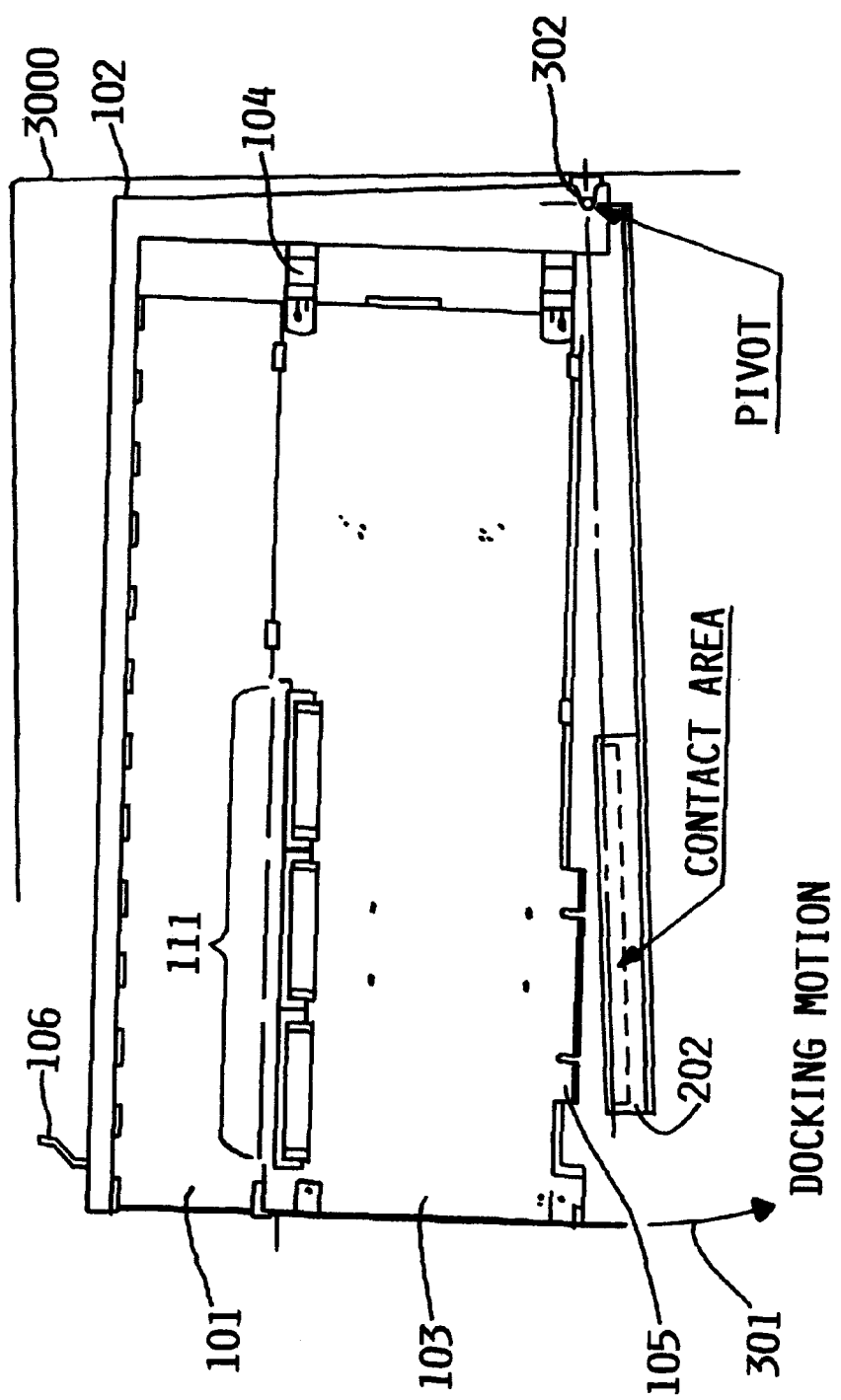
FIG. 3 illustrates docking of an electronics card using an autodocking assembly according to an exemplary embodiment of the invention.

FIG. 3 shows how, after the card/card holder assembly has been installed into the pivot arm 102, the pivot arm 102 can be pivoted in the direction of arrow 301 about the pivot point 302 in order to dock the card edge connector 105 into slot connector 202. By virtue of the alignment of the pivot arm 102 with the card/card holder assembly installed therein, the docking of the card edge connector 105 into slot connector 202 is accomplished without any disadvantageous misalignment of the electrical contacts of the connectors 105, 202, which could result in adverse electrical consequences to the electronics on the card 103 and/or the PCI motherboard/backplane 201 during hot-plugging. As mentioned at the outset, hot-plugging refers to plugging/unplugging a component while the computer system is electrically powered-up. i.e., "hot," and is a desirable capability since inconvenient and/or expensive down time is avoided.

It should be apparent that to achieve the hot-pluggability, the pivot point 302 should be located at an adequate distance from the slot connector 202 so that the pivot motion defines a flat enough arc, i.e., approaching perpendicular at the point where the edge connector 105 enters the slot connector 202, to avoid any misalignment of contacts. Also, since the slot in the slot connector 202 is closed at its ends, i.e., has a limited extent at the front and back as does the card edge connector 105, if the arc were not flat enough, there could be binding of the connector 105 in the slot 202.

Therefore, the pivot arm 102 and card holder 101 are designed to provide an adequately flat arc for a given minimum distance between the pivot point 302 and the slot connector 202. In other words, the arc is such that it approaches perpendicular at the point where the edge connector 105 enters the opening of the slot connector 202. A suitable distance between the pivot point 302 and the slot connector 202 has been determined experimentally to be a minimum of 293.63 mm for a 3.3 volt PCI card. For other types of cards/slot connectors, the minimum distance would be different, and can be determined experimentally for the type of card/slot in question, based on the location of the connector key as defined by the associated bus specification, for example. Clearly, the pivot point 302 could be located somewhere on the motherboard 201, or adjacent thereto on the computer housing 3000, or other structure, such as a board stiffener 4000.

It may be advantageous to provide the pivot point 302 as an attached structure on the motherboard 201 so that mounting of the motherboard 201 within a housing would not affect the pivot alignment. Also, it should be clear that the pivot point 302 would also be aligned with respect to the extending direction of the connector slot 202 so that card edge connector 105 would extend coincident in alignment therewith when installed in the autodocking assembly 100.

The latch 106 can serve to secure a card holder 101 in the channel of pivot arm 102, as well as providing a convenient way to hold the pivot arm 102 up during insertion/removal of a card/card assembly. Of course, other ways of holding the pivot arm 102 up during this insertion/removal could be provided, for example, by means of a detent or latch at the pivot point 302.

Figure 4:
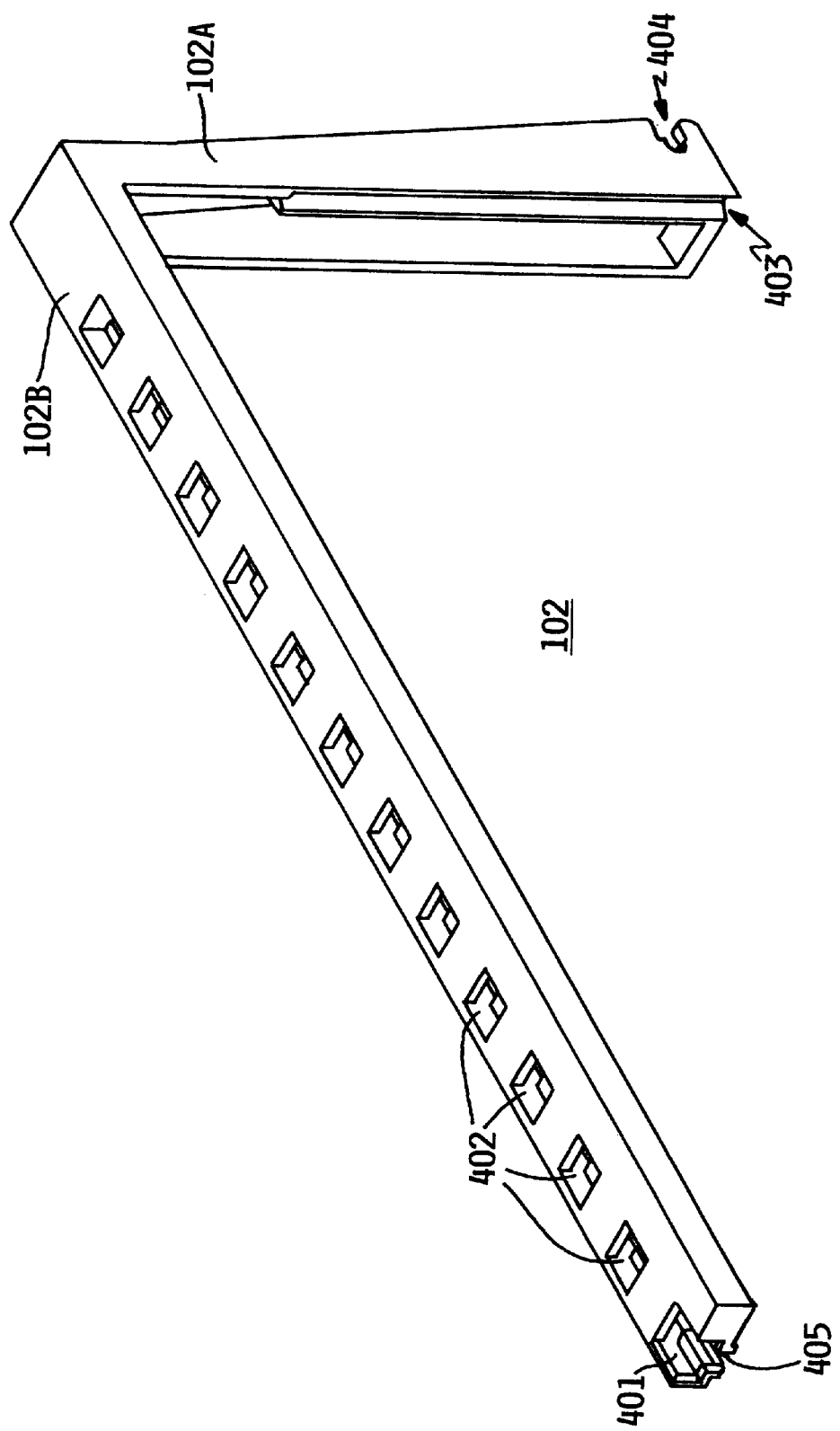
FIG. 4 illustrates a pivot arm in more detail according to an exemplary embodiment of the invention.
Figure 5:
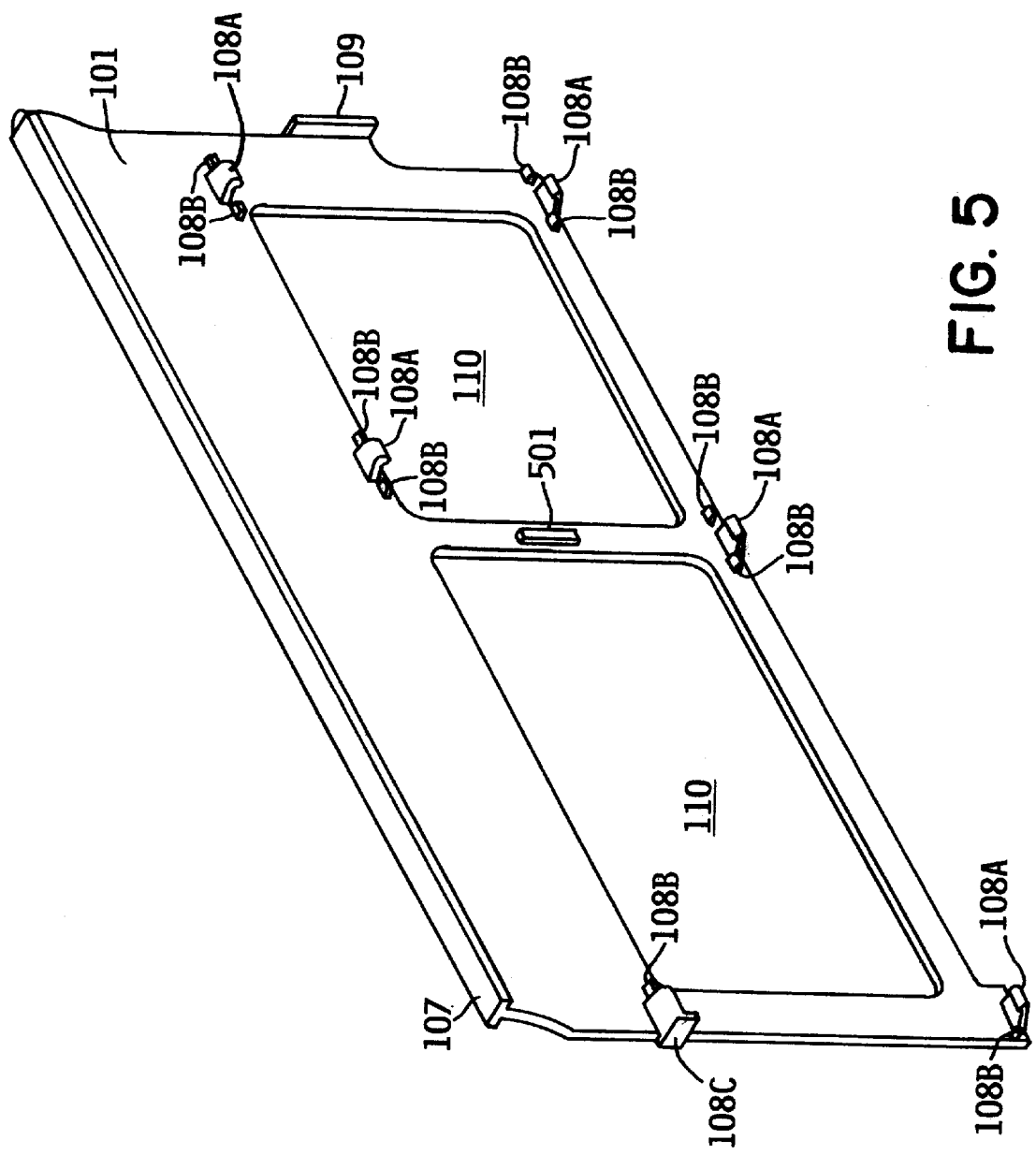
FIG. 5 illustrates a card holder in more detail according to an exemplary embodiment of the invention.

Turning next to FIGS. 4 and 5, the pivot arm 102 and the card holder 101, according to the exemplary embodiment, are illustrated in more detail. The pivot arm 102 has two integrally formed segments, 102A and 102B in this embodiment, however, these could alternatively be formed as separate pieces attachable together. In FIG. 4, a channel 401 in the upper segment 102B of pivot arm 102, into which the flanged edge 107 of card holder 101 is inserted during installation, can be easily seen. Distributed along the top of the pivot arm upper segment 102B are a number of through holes 402 which provide for the formation of molded curves during manufacturing within the channel 401 of the pivot arm 102, which molded curves aid in facilitating insertion and removal of a card holder edge 107.

If desirable, these holes could also be used to provide an additional passage for a cooling gas, such as air, therethrough. In this case, through holes corresponding to through holes 402 could also be provided along the bottom edge of the upper segment 102B, although they would not be visible in this view.

On the upright segment 102A of the pivot arm 102 there is provided a slot 403 into which the retainer 104 fits securely when the card/card holder assembly is installed into the pivot arm 102. The upright segment 102A also has a notch 404 for receiving a pivot rod therein. The notch 404 may provide for a snap-fit of the pivot rod, or other means could be provided for securing the pivot arm 102 to a pivot rod, as would be apparent to one skilled in the art. A pivot rod assembly could be provided on a motherboard/backplane, or on a housing or frame, for example.

As can also be seen, the channel 401 has a slot 405 at the bottom along which the card holder 101 can pass during installation. The channel 401 as illustrated is configured to receive the T-shaped flanged edge 107 (rail) of card holder 101. As would be readily apparent to one skilled in the art, other shapes of channels/flanges could be used, for example L-shaped or V-shaped. It should be noted that latch 106 is omitted from FIG. 4 for the purposes of better illustration of the pivot arm details.

This flanged edge 107 can be more easily seen in FIG. 5. The details of the protrusions 108 mentioned with respect to FIG. 1, can be seen in more detail in FIG. 5. Protruding portions 108A are provided spaced along card holder 101 and these serve to orient and secure an electronics card to the card holder 101. Protruding portions 108B serve to space an electronics card from the surface of the card holder 101 and thereby provide a space through which a cooling gas, such as air, can pass between the card holder 101 and a card via through holes 110. This spacing may also serve to provide clearance between the surface of card holder 101 and an electronics card preventing any possible damage to the side of the electronics card that faces the card holder surface during installation. Stop 109 aligns a front edge of an electronics card in the card holder 101. Stop 108C serves to align the rear edge of an electronics card within the card holder 101.

The card holder 101 and pivot arm 102 may be conveniently formed of molded plastic material for example, however other materials could be used as would be apparent to one skilled in the art.

Figure 6:
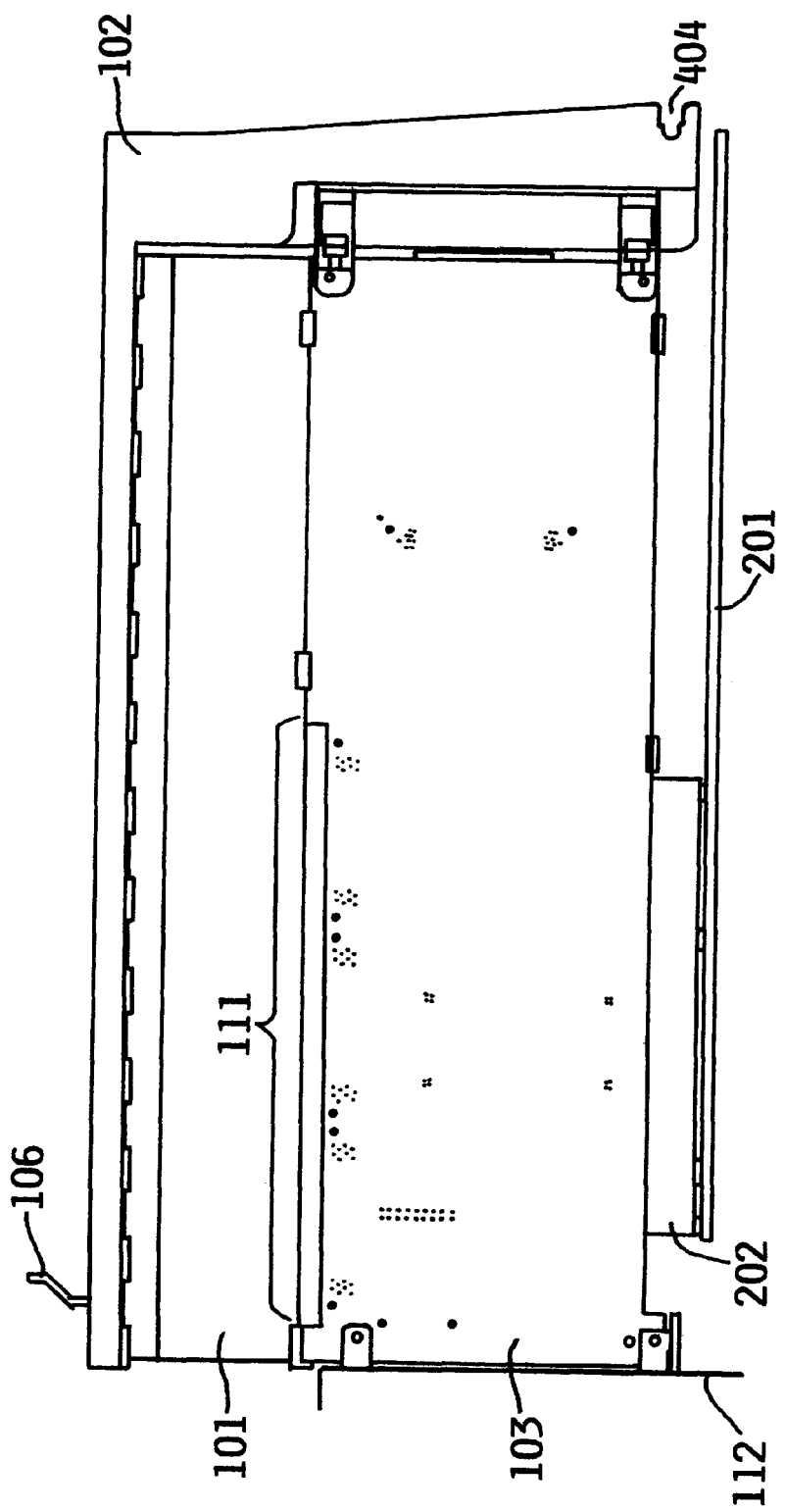
FIG. 6 illustrates a docked assembly viewed from the left side according to an exemplary embodiment of the invention.
Figure 7:
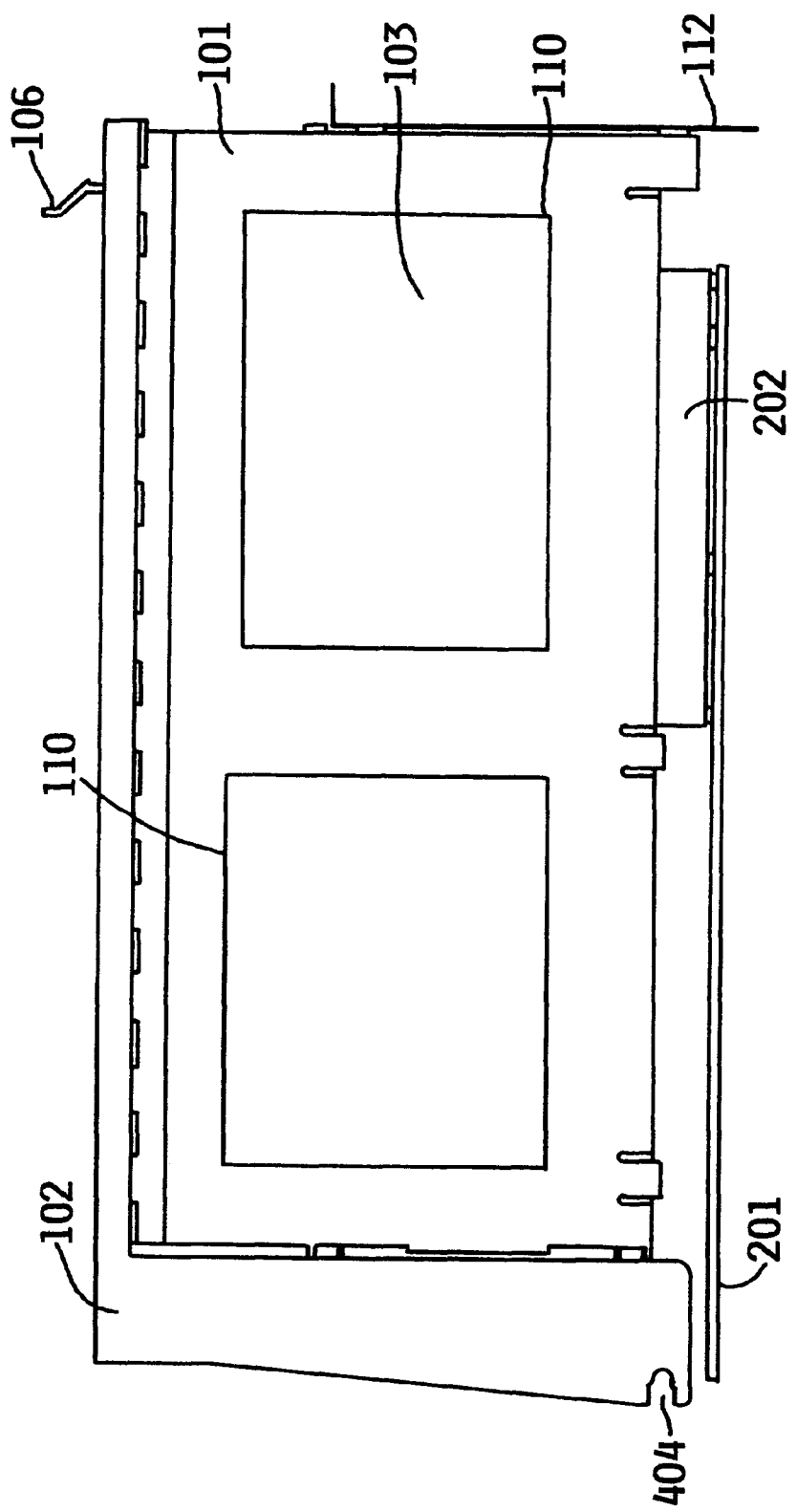
FIG. 7 illustrates a docked assembly viewed from the right side according to the exemplary embodiment of the invention illustrated in FIG. 6.

FIGS. 6 and 7 show left and right sides, respectively, of an autodocking assembly 100 with an electronics card 103, where the card edge connector 105 is fully inserted in slot connector 202 on motherboard/backplane 202. As can be seen in FIG. 6, the connector or connectors 111 along a top edge of the electronics card 103 are spaced some distance from the pivot arm 102, allowing for ample clearance to the connectors 111 so that they can be accessed.

Figure 8:
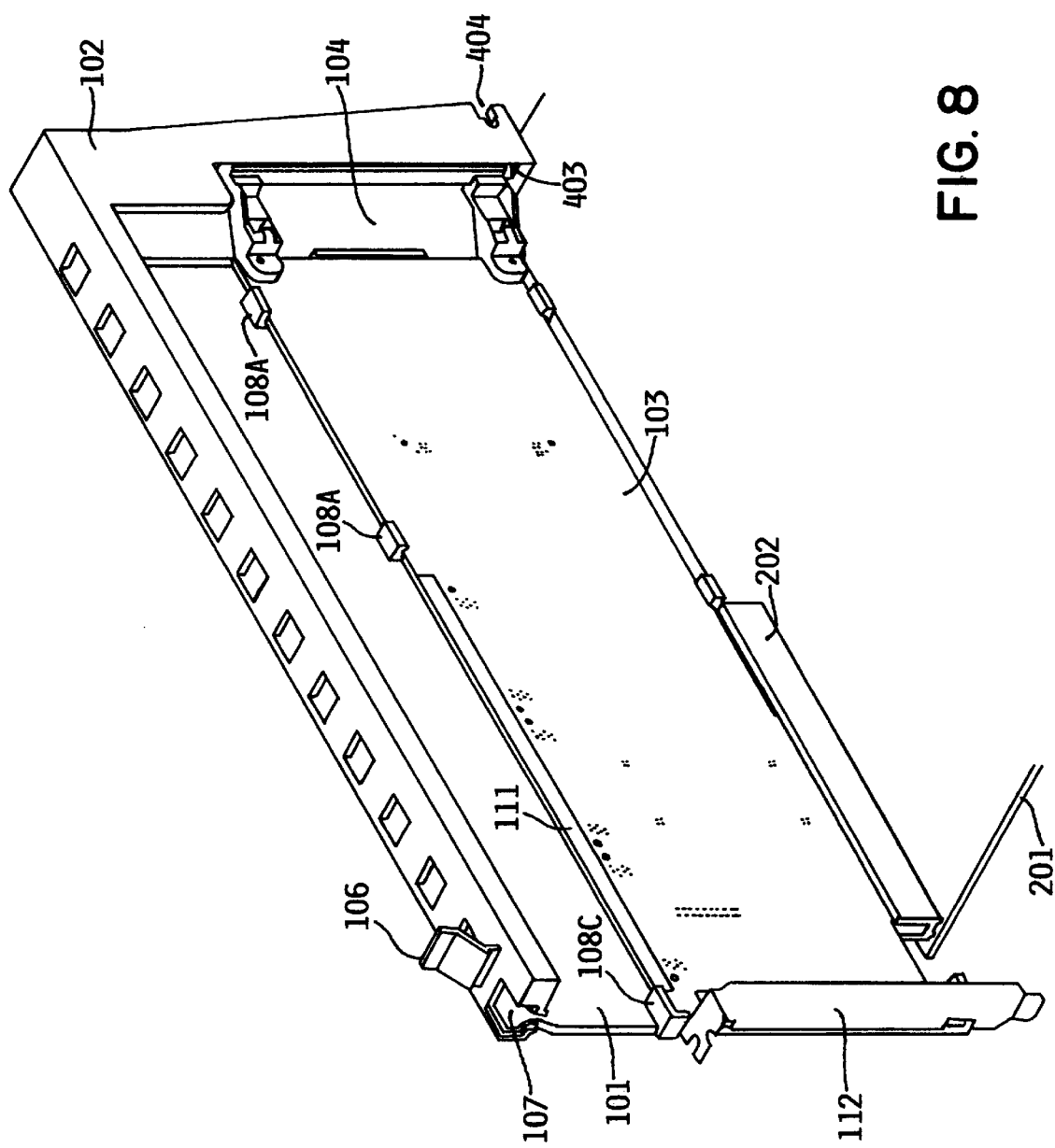
FIG. 8 illustrates a perspective view of the docked assembly according to the exemplary embodiment of the invention illustrated in FIG. 6.
Figure 9:
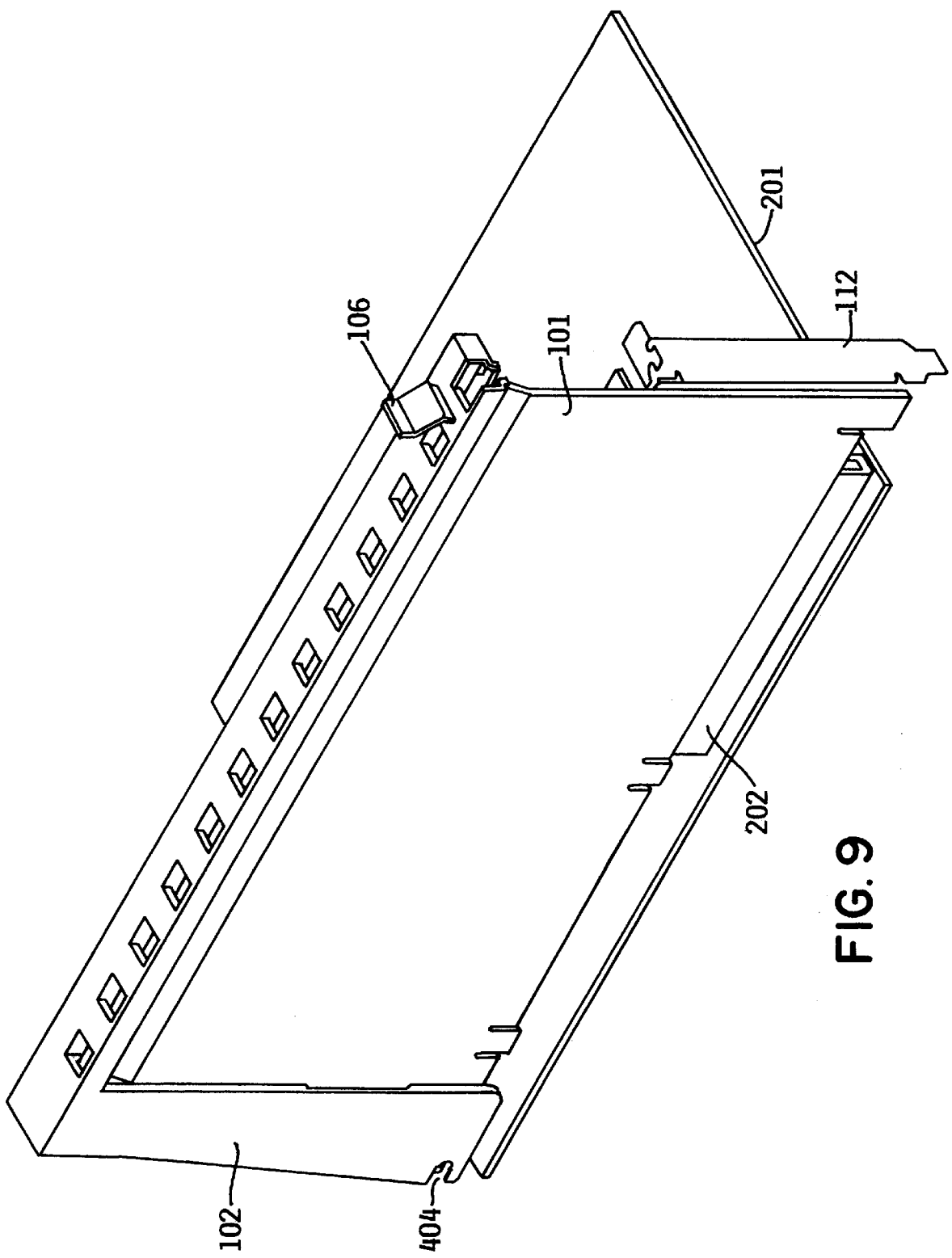
FIG. 9 illustrates a perspective view of the docked assembly according to the exemplary embodiment of the invention illustrated in FIG. 7.

FIGS. 8 and 9 similarly show left and right sides of an installed autodocking assembly, from a perspective view. As may be apparent to those skilled in the art, the PCI electronics card 103 illustrated is a full length card. However, the invention is not limited to accommodating only full length cards. As would be apparent to one skilled in the art, the illustrated card holder 101, with or without modification, could accommodate half-length PCI cards as well. As illustrated in FIG. 1A, a half-size spacer panel 103B is used to adapt a full-sized card holder 101 for use with a half-sized card 103A.

Alternatively, an optional stop 501 shown in FIG. 5 could be provided to align the front end of a half-length card in a card holder 101. The stop 501 could be provided as a break-away piece which could be removed when a full length PCI card is used with card holder 101, as would be readily apparent to those skilled in the art. In this case, the through-hole 110 not covered by the half-sized card could also be covered by a break-away piece (not shown). It may be advantageous not to have an uncovered through-hole since a cooling gas could be disadvantageously diverted away from the electronic card 103A through such an uncovered through-hole.

It will be apparent to one skilled in the art that the manner of making and using the claimed invention has been adequately disclosed in the above-written description of the preferred embodiments taken together with the drawings.

It will be understood that the above described preferred embodiments of the present invention are susceptible to various modifications, changes, and adaptations, and the same are intended to be comprehended within the meaning and range of equivalents of the appended claims.

For example, while it is highly desirable to provide a mechanism for accommodating card devices produced by original equipment manufacturers (OEMs), it should be apparent that portions of the invention could be integrated with the card device substrate during manufacture. The card holder, for example, could be made as an integral part of the substrate of the card device. This would eliminate one step in the assembling of the arrangement, i.e., the snapping of the card device to the card holder.

Further, although the illustrated and described embodiment is for use with PCI cards, the card holder could be adapted to accommodate other types of card devices, such as those mentioned earlier, as well as future card device types as they are developed.

Although the illustrated and described embodiment uses a rigid pivot arm which has right angled segments, and which pivots for insertion of the card device edge connector in the corresponding slot connector, other arrangements are possible. For example, just as the card holder slides into a channel of the pivot arm upper segment in the described embodiment, alternatively, an upright channel arm structure could be provided on the computer system housing into which a separate support arm (replacing the pivot arm upper segment) or the front end of the card holder would slide in and out in a direction perpendicular to the motherboard or backplane. Once the card holder was secured in the upright channel arm structure, the assembly could be pivoted to achieve docking. In other words, the pivot arm in this alternative is essentially simply an upright segment with a card holder secured thereto, in effect dividing the illustrated pivot arm into separate pieces corresponding to the upper segment 102B and the lower upright extending segment 102A.

Further, just as a latch is provided which may be used to secure the card holder in the channel of the pivot arm, so to a latch could be provided to secure the pivot arm to the pivot structure. The latch could have the ability to secure the pivot arm in two positions: an angled upright position, in which the card holder can be inserted or removed; and a horizontal position, in which the card device edge connector is fully inserted in the corresponding slot connector. This likewise could be accomplished by a detent mechanism.

While the components of the autodocking assembly have been disclosed as being made of a plastic material, any suitable material could be used. By suitable is meant a material which provides adequate strength and ease of manufacture to be practical.

What is claimed is:

1. An autodocking assembly for use with a circuit board comprising:
    a card holder adapted to accommodate and secure one of a plurality of electronic cards therein; and
    a separate pivot arm, removably attached to the card holder, and which is adapted to pivot about a pivot point with the card holder attached such that an edge connector of the one electronic card in the card holder docks with a corresponding slot connector on the circuit board;
    wherein the card holder has a rail on an edge thereof, the pivot arm is essentially L-shaped and includes an upright segment and an extending segment, the extending segment extending at substantially a right angle from the upright segment, the extending segment having a channel adapted to receive the corresponding card holder rail so that the card holder is slidably received thereby, and a latch for securing the pivot arm, the upright segment having an end away from the extending segment, the end including the pivot point about which the pivot arm pivots.

2. The assembly according to claim 1, further comprising a pivot rod about which the separate pivot arm pivots;
    wherein the pivot rod is disposed on one of:
        the circuit board;
        a housing in which the circuit board is disposed; or
        a board stiffener;
    whereby the pivot rod is disposed at a location which enables the edge connector of the one electronic card in the card holder received in the separate pivot arm to dock with the corresponding slot connector on the circuit board without misalignment.

3. The assembly according to claim 2, wherein the card holder is slidably removable from the separate pivot arm, and the separate pivot arm is removably attached to the pivot rod.

4. The assembly according to claim 2, wherein the pivot rod is disposed at a distance from the corresponding circuit board slot connector so that the edge connector of the one electronic card in the card holder received in the separate pivot arm docks with the corresponding slot connector on the circuit board without binding.

5. The assembly according to claim 2, wherein the pivot rod is disposed in alignment with a center of the corresponding circuit board slot connector.

6. An autodocking assembly for use with a circuit board comprising:
    a card holder adapted to accommodate and secure one of a plurality of electronic cards therein; and
    a pivot arm, attached to the card holder, which is adapted to pivot about a pivot point with the card holder attached thereto, such that an edge connector of the one electronic card in the card holder docks with a corresponding slot connector on the circuit board;
    wherein the card holder has a rail on an edge thereof, the pivot arm is essentially L-shaped and includes an upright segment and an extending segment, the extending segment extending at substantially a right angle from the upright segment, the extending segment having a channel adapted to receive the corresponding card holder rail so that the card holder is slidably received thereby, and a latch for securing the pivot arm, the upright segment having an end away from the extending segment, the end including the pivot point about which the pivot arm pivots;
    wherein the pivot arm upright segment includes a slot for securably receiving a retainer disposed on the one electronic card when the card holder is slidably received in the pivot arm.

7. The assembly according to claim 6, wherein the card holder is adapted to provide a clearance to at least one further connector disposed at or near an edge of the one electronic card opposite the edge connector when the card holder is slidably received in the pivot arm.

8. The assembly according to claim 1, wherein the separate pivot arm includes at least one passage through which a cooling gas can pass.

9. The assembly according to claim 1, wherein the card holder includes at least one passage through which a cooling gas can pass.

10. The assembly according to claim 1, wherein the card holder is adapted to receive at least one of the following types of electronic cards: a full length peripheral component interconnect (PCI) card; a half length peripheral component interconnect (PCI) card; a 32 bit peripheral component interconnect (PCI) card; a 64 bit peripheral component interconnect (PCI) card; an industry standard architecture (ISA) card; an expanded ISA cards (EISA) card; a small computer system interconnect (SCSI) card; a micro channel architecture (MCA) card; a video electronics standards association (VESA) card; an accelerated graphics port (AGP); and a universal system bus (USB) card.

11. The assembly according to claim 1, wherein the card holder includes snap guides which receive and secure the one electronic card to the card holder.

12. A computer system having a housing and a circuit board and including the assembly according to claim 1.

13. A method of autodocking an electronics card to a circuit board comprising utilizing an assembly including:
    a card holder adapted to accommodate and secure one of a plurality of electronic cards therein; and
    a separate pivot arm, removably attached to the card holder, and which is adapted to pivot about a pivot point with the card holder attached such that an edge connector of the one electronic card in the card holder docks with a corresponding slot connector on the circuit board;
    wherein the card holder has a rail on an edge thereof, the pivot arm is essentially L-shaped and includes an upright segment and an extending segment, the extending segment extending at substantially a right angle from the upright segment, the extending segment having a channel adapted to receive the corresponding card holder rail so that the card holder is slidably received thereby, and a latch for securing the pivot arm, the upright segment having an end away from the extending segment, the end including the pivot point about which the pivot arm pivots.

14. The assembly according to claim 10, wherein the card holder comprises protrusions which space an electronic card from the card holder providing the at least one passage when an electronic card is secured therein.

15. A method of autodocking an electronic card edge connector to a circuit board slot connector, comprising:
   providing a card holder and a separate, essentially L-shaped pivot arm which includes an upright segment and an extending segment, the extending segment extending at substantially a right angle from the upright segment, the extending segment having a channel adapted to receive the corresponding card holder rail so that the card holder is slidably received thereby, and a latch for securing the pivot arm, the upright segment having an end away from the extending segment, the end including a pivot point about which the pivot arm points disposed a distance from the circuit board slot connector;
   securing the electronic card to the card holder;
   removably attaching the card holder to the separate pivot arm; and
   pivoting the separate pivot arm about the pivot point;
   whereby the edge connector of the electronic card docks with the corresponding slot connector on the circuit board.

16. An assembly for use with an electronics circuit card having an edge connector, and a circuit board having a slot connector adapted to receive the edge connector, the assembly comprising:
   a card holder having a rail for securing the electronics circuit card thereon; and
   a separate docking means for removably receiving the card holder, and being movable with the card holder received thereon, to cause the edge connector to dock with the slot connector;
   wherein the docking means comprises an essentially L-shaped pivot arm which includes an upright segment and an extending segment, the extending segment extending at substantially a right angle from the upright segment, the extending segment having a channel adapted to receive the corresponding card holder rail so that the card holder is slidably received thereby, and a latch for securing the pivot arm, the upright segment having an end away from the extending segment, the end including a pivot point about which the pivot arm pivots.

17. The assembly according to claim 16, wherein the card holder rail has a flanged edge and the docking means has a corresponding channel which receives the flanged edge.

18. A method of autodocking an electronics card to a circuit board comprising utilizing an including:
   a card holder having a rail and adapted to accommodate and secure one of a plurality of electronic cards therein;
   an essentially L-shaped pivot arm, which includes an upright segment and an extending segment, the extending segment extending at substantially a right angle from the upright segment, the extending segment having a channel adapted to receive the corresponding card holder rail so that the card holder is slidably received thereby, and a latch for securing the pivot arm, the upright segment having an end away from the extending segment, the end including a pivot point about which the pivot arm pivots, attached to the card holder, which is adapted to pivot with the card holder attached thereto, such that an edge connector of the one electronic card in the card holder docks with a corresponding slot connector on the circuit board; and
   a pivot rod about which the pivot arm pivots;
   wherein the pivot rod is disposed on one of:
      the circuit board;
      a housing in which the circuit board is disposed; or
      a board stiffener; and
   wherein the card holder is removably attached to the pivot arm, and the pivot arm is removably attached to the pivot rod;
   whereby the pivot rod is disposed at a location which enables the edge connector of the one electronic card in the card holder received in the pivot arm to dock with the corresponding slot connector on the circuit board without misalignment.

19. A method of autodocking an electronics card to a circuit board comprising utilizing an assembly for use with an electronics circuit card having an edge connector, and a circuit board having a slot connector adapted to receive the edge connector, the assembly comprising:
   a card holder having a rail for securing the electronics circuit card thereon; and
   docking means for receiving the card holder, and being movable with the card holder received thereon, to cause the edge connector to dock with the slot connector;
   wherein the docking means comprises an essentially L-shaped pivot arm which includes an upright segment and an extending segment, the extending segment extending at substantially a right angle from the upright segment, the extending segment having a channel adapted to receive the corresponding card holder rail so that the card holder is slidably received thereby, and a latch for securing the pivot arm, the upright segment having an end away from the extending segment, the end including a pivot point about which the pivot arm pivots.

* * * * *